US010720305B2

(12) United States Patent
Van Zyl

(10) Patent No.: US 10,720,305 B2
(45) Date of Patent: Jul. 21, 2020

(54) PLASMA DELIVERY SYSTEM FOR MODULATED PLASMA SYSTEMS

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/230,923

(22) Filed: Dec. 21, 2018

(65) Prior Publication Data

US 2020/0203119 A1 Jun. 25, 2020

(51) Int. Cl.
*H01J 37/24* (2006.01)
*H01J 37/32* (2006.01)
*H01J 37/248* (2006.01)

(52) U.S. Cl.
CPC .......... *H01J 37/241* (2013.01); *H01J 37/248* (2013.01); *H01J 37/32183* (2013.01)

(58) Field of Classification Search
None
See application file for complete search history.

(56) References Cited

U.S. PATENT DOCUMENTS 3,733,608 A 5/1973 McGhay et al.
5,643,364 A 7/1997 Zhao et al.
6,020,794 A 2/2000 Wilbur
6,046,641 A 4/2000 Chawla et al.
6,537,421 B2 3/2003 Drewery
6,562,190 B1 5/2003 Kuthi et al.
6,587,019 B2 7/2003 Chawla et al.
6,887,339 B1 5/2005 Goodman et al.
7,042,311 B1 5/2006 Hilliker et al.
7,049,751 B2 5/2006 Blackburn et al.
7,967,944 B2 * 6/2011 Shannon .......... H01J 37/32082 156/345.2
7,970,562 B2 * 6/2011 Van Zyl ............ G01R 19/0007 118/723 E
8,018,164 B2 * 9/2011 Shannon .......... H01J 37/32082 156/345.2
8,330,432 B2 * 12/2012 Van Zyl .................... H03F 1/56 322/36
9,059,678 B2 * 6/2015 Long ........................ H03H 7/40
9,595,424 B2 * 3/2017 Marakhtanov .... H01J 37/32183
9,635,750 B2 * 4/2017 Cheung .................... H05H 1/30
9,721,759 B1 * 8/2017 Karlquist .......... H01J 37/32183
(Continued)

OTHER PUBLICATIONS

Young, Lee, "International Search Report and Written Opinion Regarding International Application No. PCT/US2019/052391", dated Dec. 31, 2019, p. 11 Published in: US.

*Primary Examiner* — Alexander H Taningco
*Assistant Examiner* — Srinivas Sathiraju
(74) *Attorney, Agent, or Firm* — Neugeboren O'Dowd PC

(57) ABSTRACT

Plasma processing systems and methods are disclosed. The plasma processing system includes a high-frequency generator configured to deliver power to a plasma chamber and a low-frequency generator configured to deliver power to the plasma chamber. A filter is coupled between the plasma chamber and the high-frequency generator, and the filter suppresses mixing products of high frequencies produced by the high-frequency generator and low frequencies produced by the low-frequency generator.

23 Claims, 16 Drawing Sheets

804B
3.7 pF
810
3.34 pF
820
$Z_0$=56.22 Ω
td=3.97 ns
$Z_0$=56.22 Ω
td=3.97 ns
830
840
Realized filter using lossy components 1110
1120
1130
1140
1150
1160

(56) References Cited

U.S. PATENT DOCUMENTS

| | | | | |
|---|---|---|---|---|
| 9,596,744 | B2 * | 9/2017 | Singhal | H01J 37/32 315/111.21 |
| 9,984,859 | B2 * | 5/2018 | Marakhtanov | H01J 37/32183 |
| 10,026,592 | B2 * | 7/2018 | Chen | H01J 37/32146 |
| 10,141,163 | B2 * | 11/2018 | Lill | H01J 37/32146 |
| 10,224,184 | B2 * | 3/2019 | Van Zyl | H01J 37/32146 |
| 10,249,476 | B2 * | 4/2019 | Marakhtanov | H01J 37/32183 |
| 10,312,064 | B2 * | 6/2019 | Grede | H01J 37/32944 |
| 10,340,879 | B2 * | 7/2019 | Mavretic | H01L 29/861 |
| 2007/0006972 | A1 | 1/2007 | Piptone et al. | |
| 2009/0255800 | A1 | 10/2009 | Koshimizu | |
| 2009/0315596 | A1 * | 12/2009 | Leming | H03B 21/00 327/119 |
| 2012/0074844 | A1 * | 3/2012 | York | H03H 7/40 315/111.21 |
| 2013/0320852 | A1 * | 12/2013 | Kitano | G01R 25/00 315/111.21 |
| 2014/0159580 | A1 * | 6/2014 | Fritsch | H01J 37/32174 315/111.21 |
| 2014/0239813 | A1 * | 8/2014 | Van Zyl | H01J 37/3299 315/111.21 |
| 2014/0262031 | A1 * | 9/2014 | Belostotskiy | H01J 37/3244 156/345.28 |
| 2015/0007940 | A1 * | 1/2015 | Kaneko | H01J 37/32201 156/345.41 |
| 2017/0330731 | A1 * | 11/2017 | Van Zyl | H01J 37/32183 |
| 2018/0025891 | A1 * | 1/2018 | Marakhtanov | H01J 37/32091 438/714 |
| 2018/0025930 | A1 | 1/2018 | Augustyniak | |
| 2018/0318459 | A1 * | 11/2018 | Hancock | A61L 2/26 |
| 2019/0247050 | A1 * | 8/2019 | Goldsmith | A61F 2/82 |

* cited by examiner

PLASMA DELIVERY SYSTEM FOR MODULATED PLASMA SYSTEMS

BACKGROUND

Field

The present disclosed embodiments relate generally to plasma processing systems, and more specifically to plasma processing systems with modulated plasma.

Background

Plasma processing systems for etching and deposition have been utilized for decades, but advancements in processing techniques and equipment technologies continue to create increasingly more complex systems. These increasingly complex systems lead to more problematic interactions between multiple generators driving the same plasma system.

SUMMARY

An aspect may be characterized as a plasma processing system that includes a high-frequency generator and a low-frequency generator that both deliver power to a plasma chamber. A filter of the system is coupled between the plasma chamber and the high-frequency generator, and the filter suppresses power outside of a bandwidth around a frequency of the high-frequency generator. The suppression of power at the frequency of the high-frequency generator is, at most, 2 dB, and the suppression of power at frequencies more than the frequency of the low-frequency generator from the frequency of the high-frequency generator is, at least, 2 dB higher than the suppression of power at the frequency of the high-frequency generator.

Another aspect may be characterized as plasma processing system that includes a high-frequency generator configured to deliver power to a plasma chamber and a low-frequency generator configured to deliver power to the plasma chamber. A filter is coupled between the plasma chamber and the high frequency generator, and the filter includes two or more helical resonators connected in parallel.

Yet another aspect may be characterized as a method for filtering power in a plasma processing system. The method includes supplying power to a plasma chamber with a high-frequency generator to ignite and sustain a plasma and supplying power to a plasma chamber with a low-frequency generator that is connected to the plasma. Power of mixing products is suppressed with a filter to limit variation of a time-varying load reflection coefficient presented to the high frequency generator.

DETAILED DESCRIPTION

Interaction between generators driving the same plasma where one of the generators modulates the load seen by another generator is becoming increasingly problematic as power levels are increased; thus, there is a need for new and improved methods and systems for dealing with this problem.

The word "exemplary" is used herein to mean "serving as an example, instance, or illustration." Any embodiment described herein as "exemplary" is not necessarily to be construed as preferred or advantageous over other embodiments.

Figure 1:
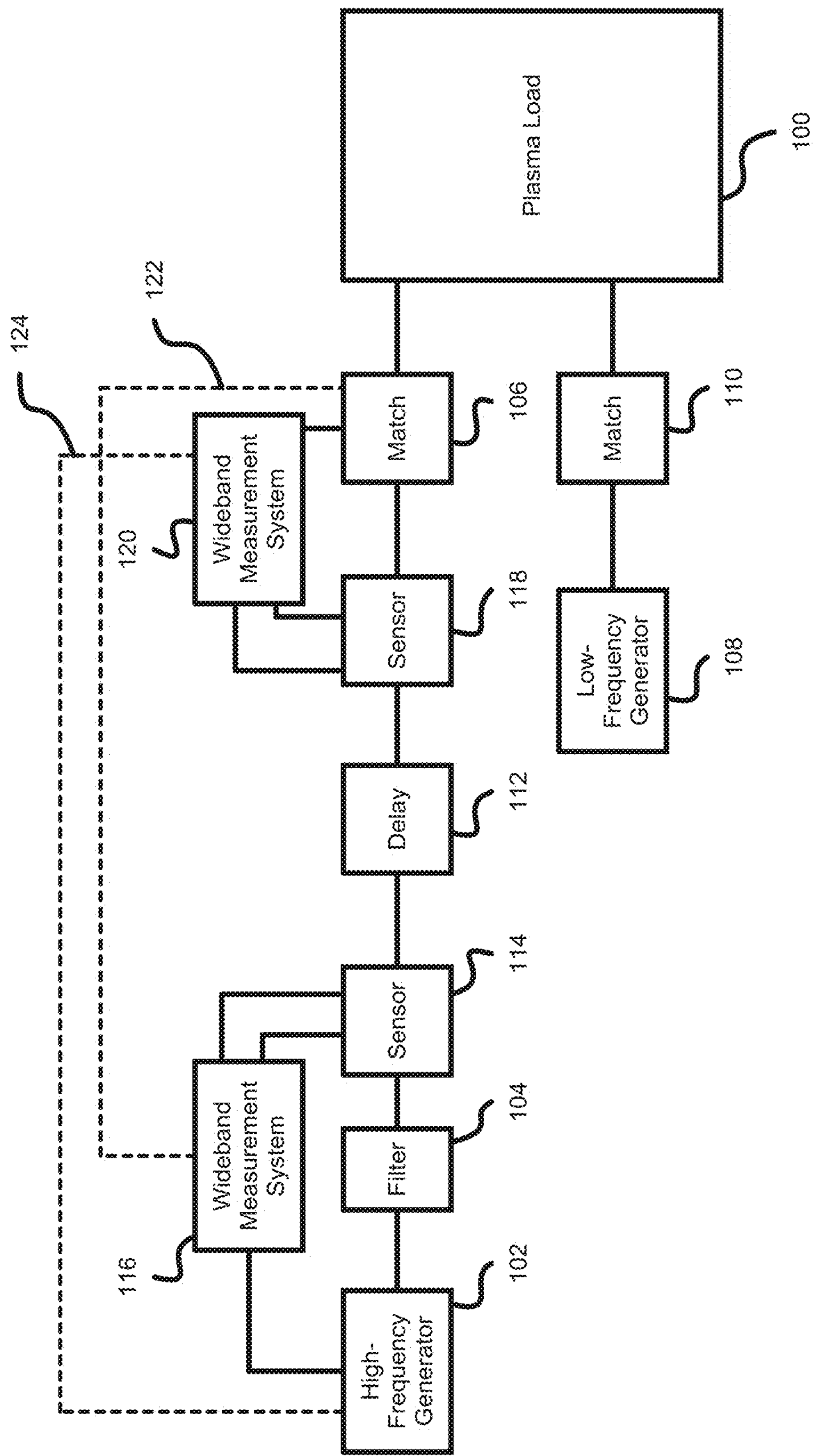
FIG. 1 is a block diagram of a plasma processing system.

Referring to FIG. 1, shown is a block diagram depicting an exemplary environment in which embodiments may be implemented. As shown, a plasma load of a plasma chamber 100 is coupled to a high-frequency generator 102 via a filter 104 and a match network 106. In addition, a low-frequency generator 108 is also coupled to the plasma load via match 110. In many applications the match 106 may be combined with the match 110. Also shown are optional wideband measurement components 114, 116, 118, and 120 and an optional delay component 112. The optional delay element 112 can be realized using a length of coaxial cable or a fixed or variable RLCM (i.e., a circuit containing resistors, inductors, capacitors and coupled inductors) circuit or a circuit containing distributed circuit elements (i.e. transmission line circuits). Also shown are optional connections 122 and 124 that allow one of the optional wideband measurement systems 116, 120 to take over functionality of the other if the optional delay element 112 is properly characterized.

Although the high-frequency generator 102 and the low frequency generator 108 may each operate over a range of frequencies, in general, the high frequency generator 102 operates at a frequency that is higher than the low-frequency generator 108. In many embodiments, the high-frequency generator 102 may be a generator that delivers RF power to the plasma load in the plasma chamber 100 in the 10 MHz to 200 MHz frequency range, and the low frequency generator 108 may be, for example, in the 100 kHz to 2 MHz range. So, exemplary frequency ratios of the frequency of the low-frequency generator 108 to that of the high-frequency generator 102 are between 0.0005 and 0.2. In many embodiments for example, the frequency ratio of the frequency of the low-frequency generator 108 to that of the high-frequency generator 102 is less than 0.05, and in some embodiments the frequency ratio of the low-frequency generator 108 to the high-frequency generator 102 is less than 0.01. For example, the ratio may be 1:150 or about 0.0067.

In terms of applications, the high-frequency generator 102 may be used to ignite and sustain the plasma load in the plasma chamber 100, and the low-frequency generator 108 may be utilized to apply a periodic voltage function to a substrate support of the plasma chamber 100 to effectuate a desired distribution of ion energies at a surface of a substrate in the plasma chamber 100.

With respect to power levels, the low-frequency generator 108 may apply a relatively large amount of power (e.g., in the 10 kW to 30 kW range) to the plasma load of the plasma chamber 100. The large amount of power applied to the plasma at low frequency modulates the plasma impedance presented to a high-frequency generator 102.

Applicant has found that, in prior systems with a generator (e.g., the low-frequency generator 108) that modulates the plasma load, power is not measured at a sufficient number of mixing products generated by the system. And failure to do so is a problem that leads to errors on the order of 100% or more in power measurement. Typical approaches taken in the past (when there is low-frequency power perturbing the plasma) is to simply filter out the mixing frequency components that result from applying high frequency power to a load that is modulated at a low frequency (e.g., filtering out 59.6 MHz and 60.4 MHz components when the low and high generator frequencies are 400 kHz and 60 MHz, respectively). But when a low pass filter is utilized, the apparent complex impedance trajectory collapses to a point, and misleadingly, it appears as though the high-frequency generator 102 is delivering power into 50 ohms.

Figure 2:
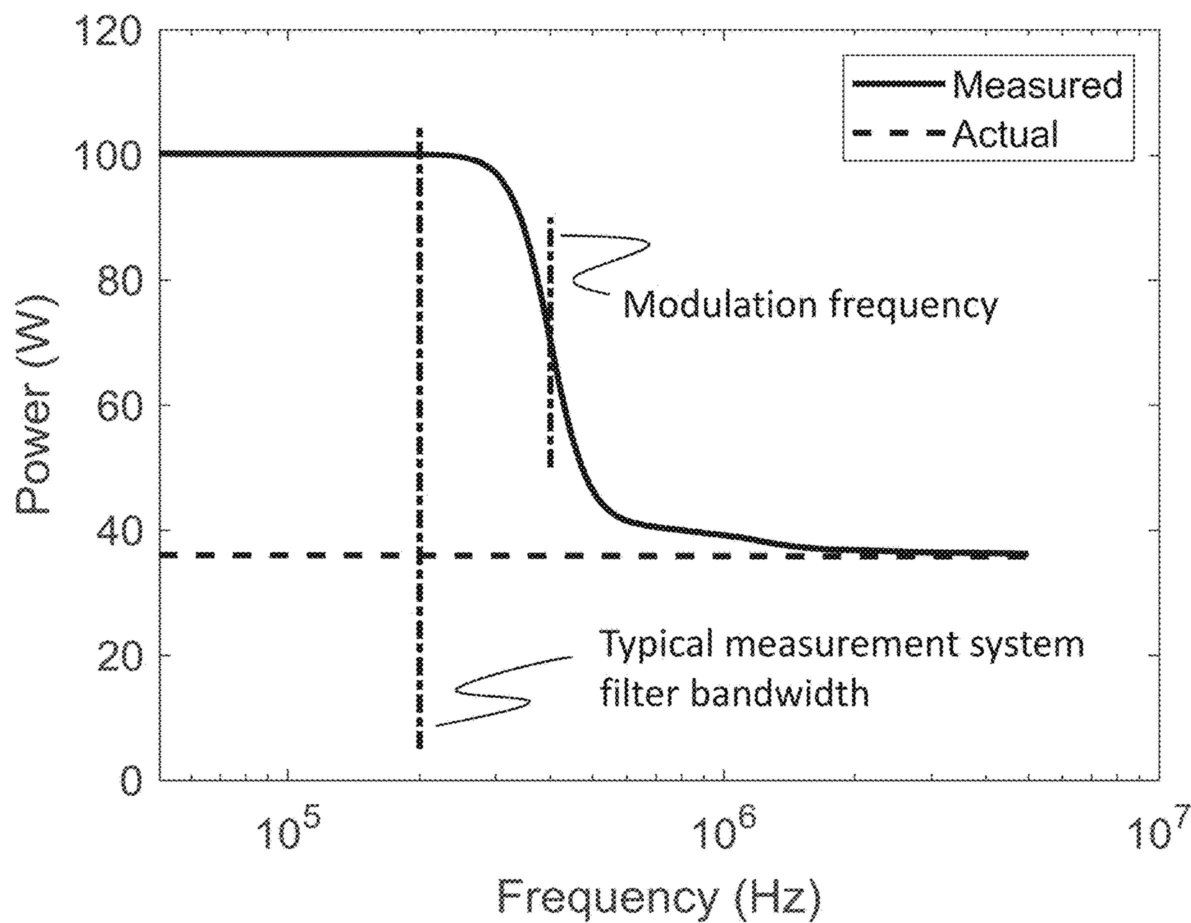
FIG. 2 is a graph depicting how power may be perceived by measuring power using different measurement-system-filter bandwidths.

Referring to FIG. 2, shown is a graph depicting how power may be perceived by measuring power using different measurement-system-filter bandwidths. The measurement system filtering is applied after down conversion or demodulation of the measured signal; thus, the measurement system filters frequency components centered on the generator output frequency. For example, a measurement system bandwidth of 100 kHz applied to a generator producing a 60 MHz output will suppress frequency components below 59.9 MHz and above 60.1 MHz. As shown, when the filter bandwidth of a measuring system is selected to be less than the modulation frequency of the plasma, then it appears as though there is much less reflected power than there actually is (so, it appears as though only forward power is going to the plasma load), but in reality, that is not what is happening.

In contrast, when power is measured with sufficient bandwidth (e.g., by one or both of the wideband measurement systems 116, 120), it is clear that only a fraction of the power (e.g., only half the power) is going to the plasma load. So, an aspect of the present disclosure includes adjusting a measurement system so that its filter bandwidth exceeds the modulation frequency to capture mixing products at higher frequencies. U.S. Pat. No. 7,970,562 entitled System, Method, and Apparatus for Monitoring Power (which is incorporated herein by reference) discloses types of sensors (e.g., directional coupler or voltage/current (VI) sensor) that may be used to realized the sensors 114, 118 in addition to the sampling and processing techniques that may be utilized by the wideband measurements systems 116, 120 to achieve a filter bandwidth that is capable of capturing information about the mixing products at higher frequencies. It should be noted that the filter bandwidth if the measurement systems 116, 120 should not be confused with the filter 104.

Figure 3A:
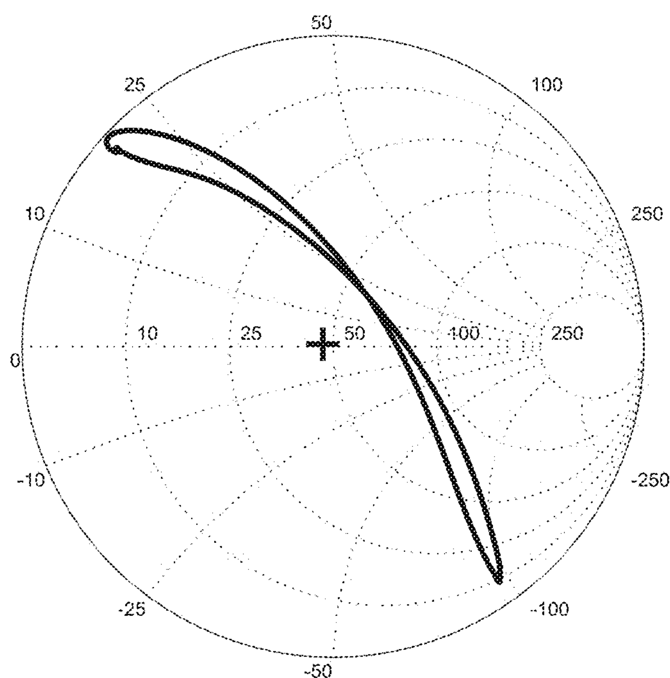
FIGS. 3A and 3B are graphs depicting modulation of load reflection coefficient.
Figure 3B:
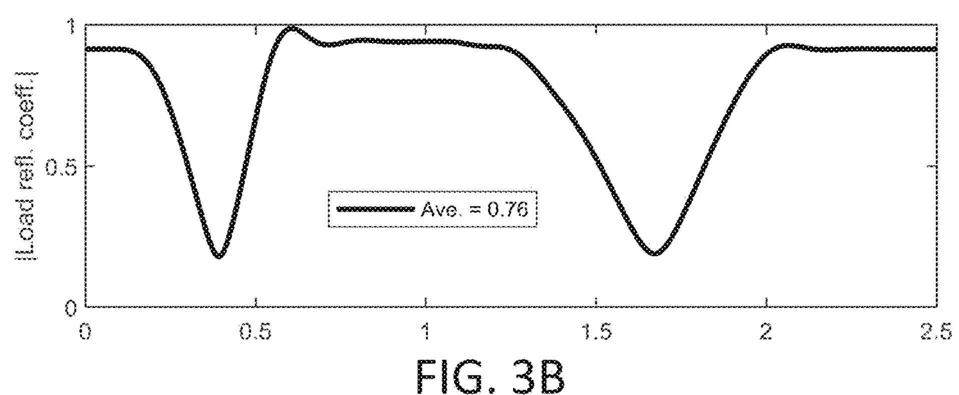
Figure 3C:
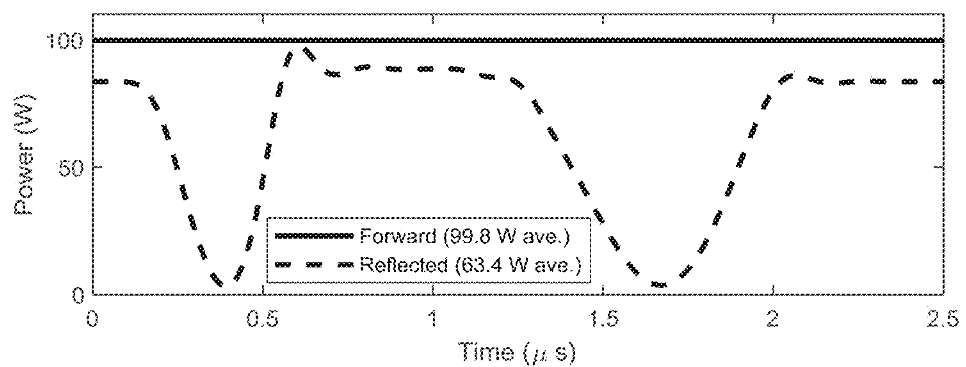
FIG. 3C is a graph depicting the resulting reflected power that may be seen by the high-frequency generator when the filter depicted in FIG. 1 is not utilized.

Another problem is that the high-frequency generator 102 needs to deliver power to a time varying load (the modulated plasma load) where the time-averaged load reflection coefficient magnitude is high. Referring to FIGS. 3A and 3B for example, shown are graphs depicting the load reflection coefficient that is seen by the high frequency generator 102 over the time period of one cycle of the low frequency generator 108, and FIG. 3C is a graph depicting resulting reflected power that may be seen by the high-frequency generator 102 when the filter 104 depicted in FIG. 1 is not utilized. As shown, the peak load reflection coefficient magnitude seen by the high-frequency generator 102 may be close to 1 (and may even exceed 1 meaning net power is flowing from the plasma load to the high-frequency generator 102) while an average load reflection coefficient magnitude seen by the high-frequency generator 102 may be 0.76. The relatively high load reflection coefficient magnitude means that, in general, the high-frequency generator 102 may struggle to apply a desired level of power and be more susceptible to failure. Thus, the high-frequency generator 102 may require many more power devices (bipolar transistors, MOSFETS, etc.) than would normally be required to deliver the required amount of power to the plasma chamber 100.

Aspects of the disclosure herein are directed to solutions to remove or mitigate against the effects of plasma modulation. An aspect depicted in FIG. 1 is the depicted filter 104. As discussed above, absent the depicted filter 104, the modulated plasma load presents a time varying nonlinear load to the high-frequency generator 102, which presents challenging problems.

In many embodiments, the filter 104 depicted in FIG. 1 may be implemented as an extremely-narrow bandwidth, high-power filter that is disposed between the high-frequency generator 102 and the plasma chamber 100. The filter 104 may have reasonably low losses at the frequency of the high-frequency generator 102 and suppress the mixing products sufficiently to limit the variation in load reflection coefficient presented to the high-frequency generator 102 at the input to the filter 104 while being stable under application of high power. When implemented, the filter 104 may have a narrow bandwidth to filter the side-band frequencies. As used herein, bandwidth is defined as a frequency range that exists between a lower-cutoff frequency and a higher-cuttoff frequency, wherein each of the cutoff frequencies is 3 dB below the maximum center or resonant peak while attenuating or weakening other frequencies outside of these two points by more than 3 dB.

In some embodiments for example, the low-frequency-generator 108 is realized by a 400 kHz generator and the high-frequency generator 102 is realized by a 60 MHz RF generator; thus, presenting a frequency ratio of 1 to 150. As a consequence, in these embodiments the filter 104 may suppress power at a frequency that is less than a percent away from a center frequency.

And in many embodiments, the suppression of power at the frequency of the high-frequency generator 102 is, at most, 2 dB, and the suppression of power at frequencies more than the frequency of the low-frequency generator 108 from the frequency of the high-frequency generator 102 is at least 2 dB higher than the suppression of power at the frequency of the high-frequency generator 102. In some implementations, the bandwidth of the filter 104 is 2% (or less) of the frequency of the high-frequency generator 102. If the high-frequency generator 102 is realized by a 60 MHz RF generator, for example, the bandwidth of the filter may be 1.2 MHz or less.

Figure 4A:
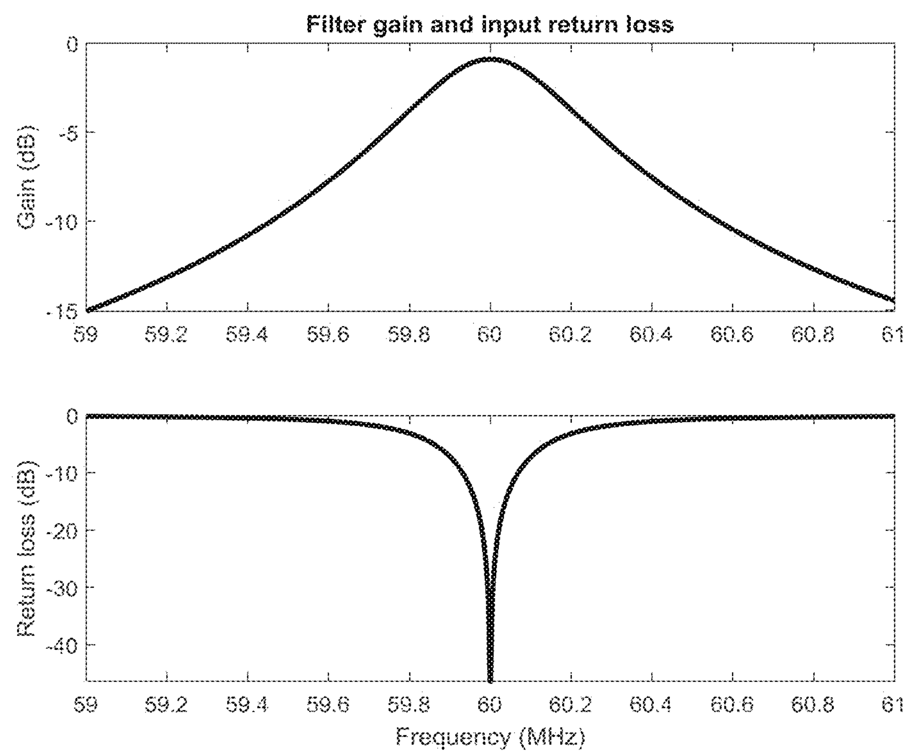
FIG. 4A includes two graphs depicting performance aspects for an exemplary design of the filter depicted in FIG. 1.
Figure 4B:
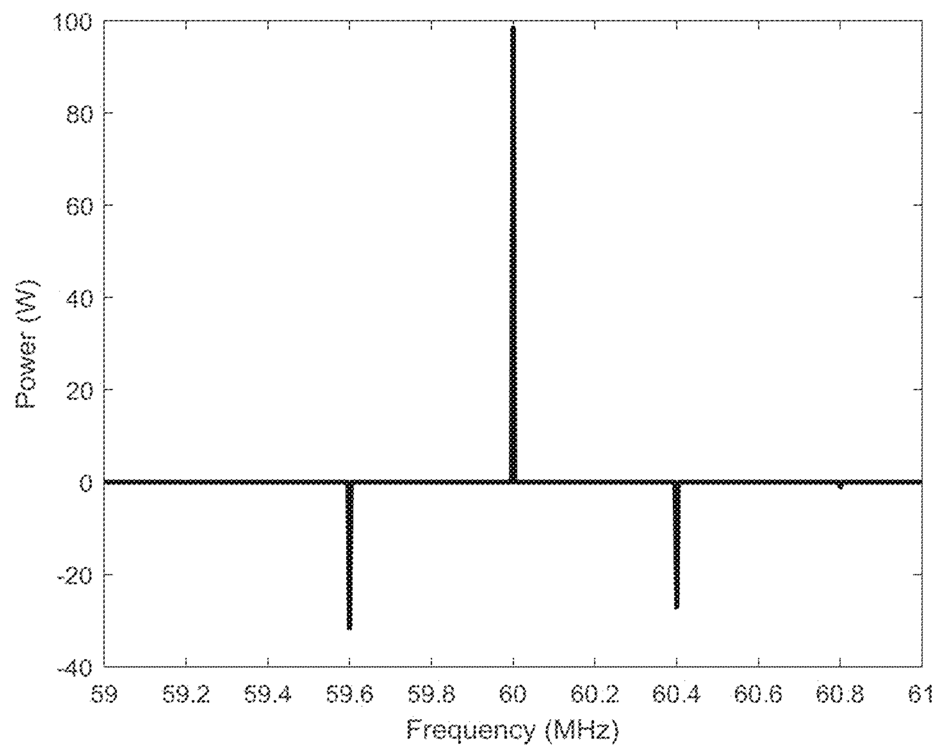
FIG. 4B is a graph depicting the net power that may be delivered to the plasma load by the high-frequency generator at the fundamental and mixing product frequencies when the filter depicted in FIG. 1 is not utilized.

Referring to FIG. 4A, shown are graphs depicting performance aspects for exemplary designs of the filter 104. In FIG. 4A, a bandwidth of the filter 104 has a center frequency of about 60 MHz, and at a fraction of a megahertz away from the center frequency, power is suppressed by 8 dB. FIG. 4B shows the net power that may be delivered to the plasma load by the high-frequency generator when the filter depicted in FIG. 1 is not utilized. FIG. 4B shows that the filter with a response such as shown in FIG. 4A will allow power delivered to the plasma load at the fundamental frequency of 60 MHz to pass from the high-frequency generator 102 to the plasma load with relatively high efficiency and suppress the power reflected from the plasma load back to the high-frequency generator 102.

But those of ordinary skill in the art have not been led to implement the filter 104 with characteristics that are similar to the filter characteristics in FIG. 4A. A lack of awareness of the underlying problem of plasma modulation is one reason. But in addition, designing a filter with the characteristics depicted in FIG. 4A is challenging (even at low power levels). But in many embodiments the filter 104 handles high amounts of power (e.g., several kW of power), and the high-power and narrow-band combination is not a combination that those of skill in the art are likely to try.

Figure 5A:
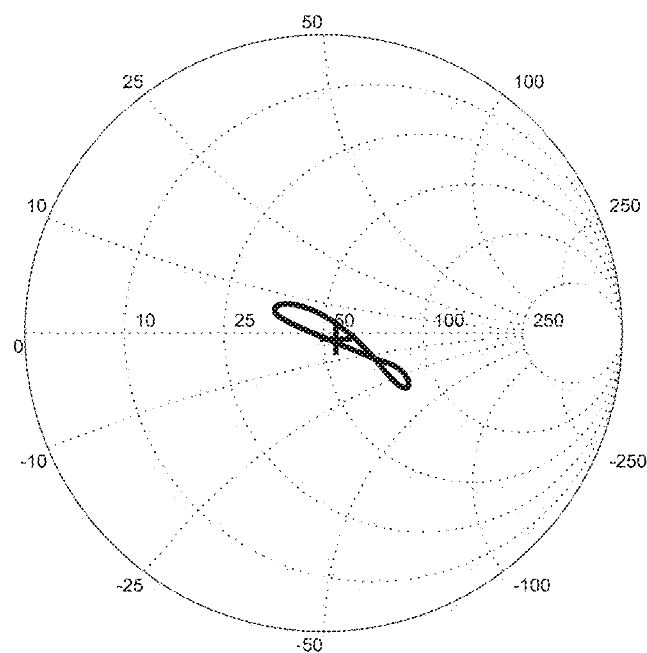
FIGS. 5A and 5B are graphs depicting modulation of load reflection coefficient.
Figure 5B:
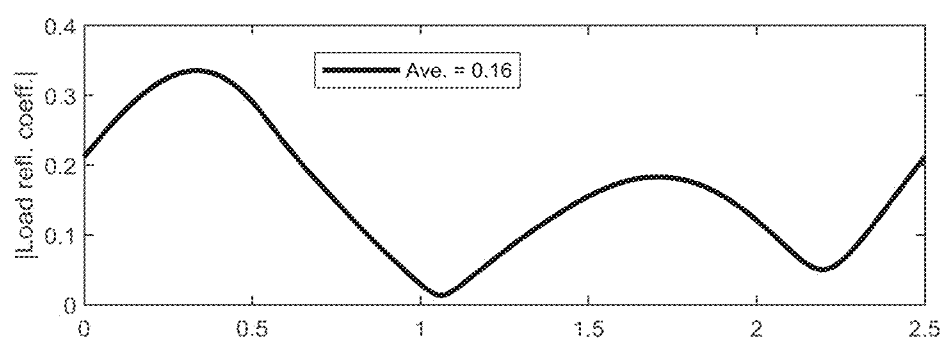

As discussed above, FIGS. 3A and 3B depict a load reflection coefficient as seen by the high-frequency generator when the filter 104 is not utilized. And FIGS. 5A and 5B depict a load reflection coefficient as seen by the high-frequency generator 102 when an exemplary filter 104 is implemented. As shown in FIG. 5A, when the filter 104 is deployed, the reflection coefficient is compressed to stay much closer to the center of the graph (as compared to the load reflection coefficient in FIG. 3A) over the cycle of the plasma's modulation.

Figure 5C:
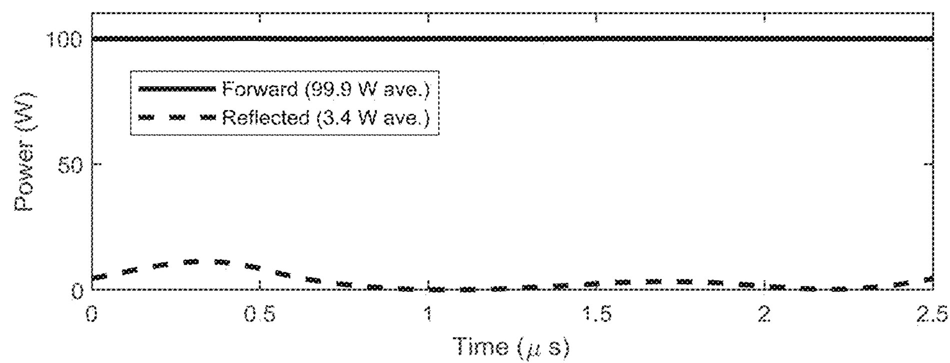
FIG. 5C is a graph depicting resulting reflected power that may be seen by the high-frequency generator when the filter depicted in FIG. 1 is utilized.

Referring to FIG. 3B, shown is a depiction of reflection coefficient magnitude in the time domain without the filter 104 being utilized. The corresponding level of forward power (close to 100 watts) depicted in FIG. 3C is much lower than the power utilized during plasma processing, but the reflection coefficient depicted in FIG. 3B, and relative magnitudes of forward and reflected power in FIG. 3C, is instructional. As shown, forward power is 99.8 watts and reflected power is 63.4 watts. In contrast, as shown in FIG. 5C, with the filter 104 in place, there are 99.9 watts of forward power and 3.4 watts of reflected power; thus, the high-frequency generator 102 is placed under much less stress. And on the load side of the filter 104, as shown in FIG. 6C, the filter 104 may increase the average forward power.

Figure 7:
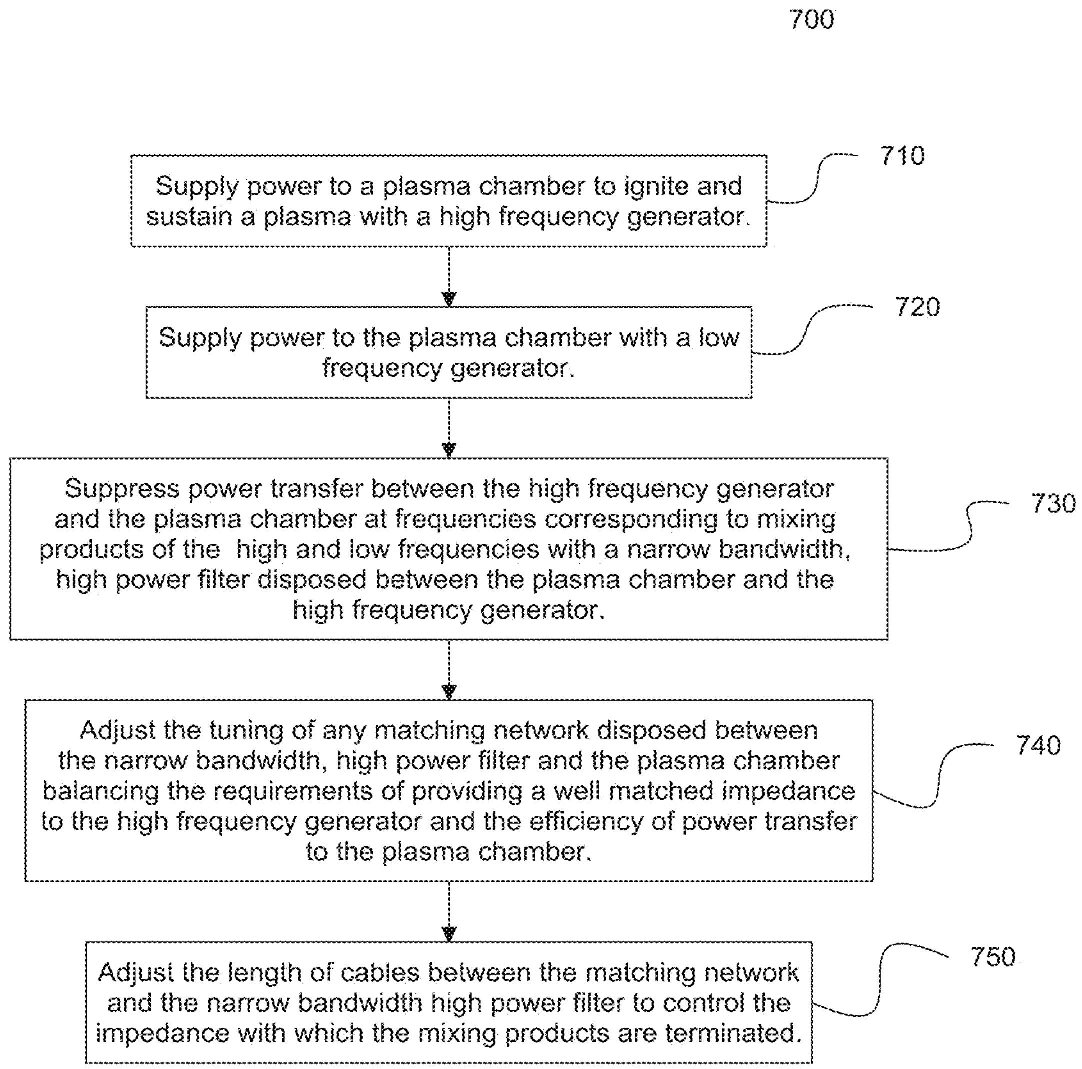
FIG. 7 is a flowchart depicting a method that may be traversed in connection with embodiments disclosed herein.

Referring to FIG. 7, shown is a flowchart 700 depicting a method for plasma processing in a modulated plasma system. As shown, power is supplied to the plasma chamber 100 with the high-frequency generator 102 to ignite and sustain a plasma (Block 710). In addition, power is supplied to the plasma chamber 100 with the low-frequency generator 108 (Block 720). Power transfer between the high-frequency generator 102 and the plasma chamber 100 is suppressed at frequencies corresponding to mixing products of the high and low frequencies with the filter 104 disposed between the plasma chamber 100 and the high-frequency generator (Block 730). The tuning of the match network 106 may be adjusted (e.g., optimized) to balance the requirements of providing a well-matched impedance to the high-frequency generator 102 and the efficiency of power transfer to the plasma chamber 100 (Block 740).

Figure 6A:
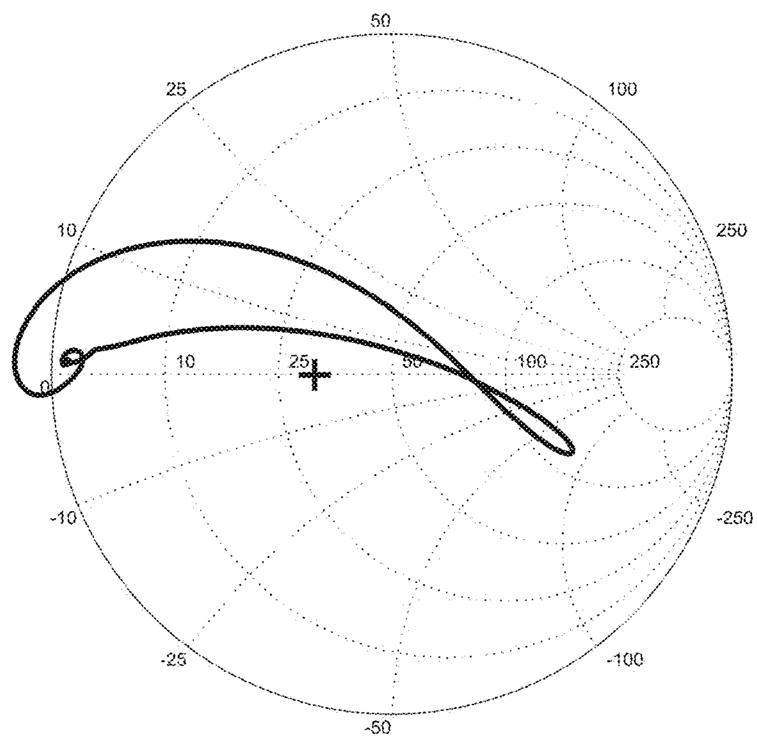
FIGS. 6A and 6B are graphs depicting modulation of load reflection coefficient.
Figure 6B:
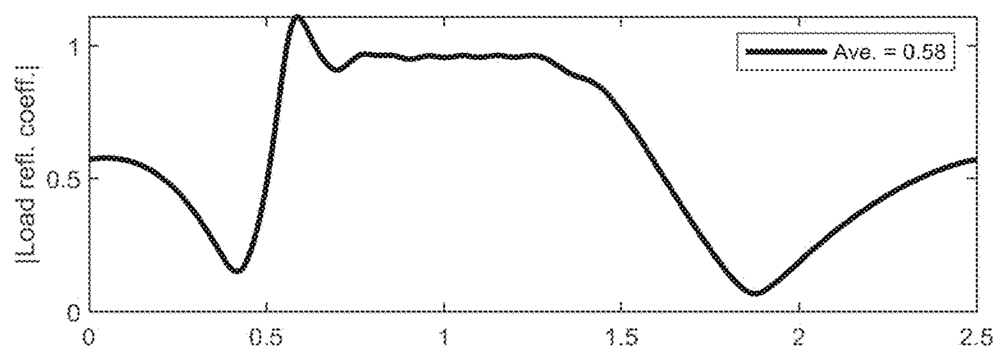
Figure 6C:
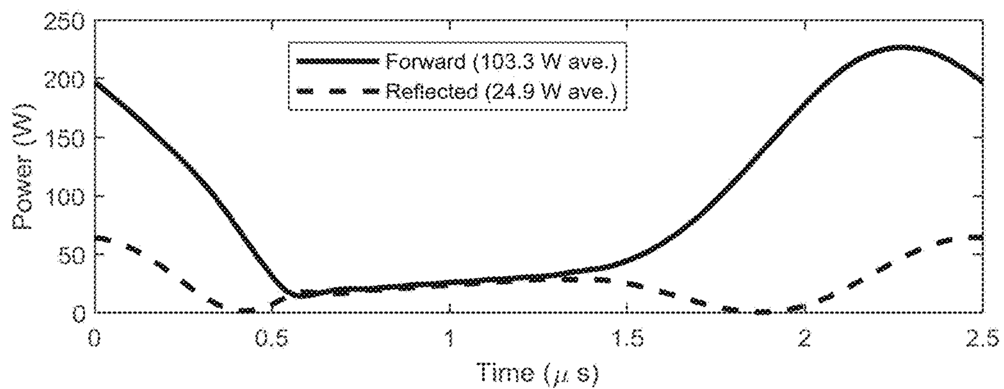
FIG. 6C is a graph depicting resulting reflected power that may be seen by the filter depicted in FIG. 1.

Referring briefly back to FIG. 6A, note that the trajectory of the load reflection coefficient is not symmetrical around the origin as is the case in FIG. 3A. This is a characteristic of the impedance required on the load side of the filter 104 in order to match the input of the filter 104 to a load reflection coefficient that is close to zero and get efficient power transfer from the high-frequency generator 102 to the plasma load. The average load reflection coefficient on the load side of the filter 104 is indicated with a "+" in FIG. 6A. The average value of the load reflection coefficient on the load side of the filter 104 as indicated in FIG. 6A is approximately −0.23 −j0.00. The average value of the load reflection coefficient on the high-frequency generator 102 side of the filter 104 as indicated in FIG. 5A is approximately 0.04 −j0.02. This illustrates an aspect of using this filter 104, namely that the load reflection coefficient on the load side of the filter 104 is not tuned to a matched load (50 ohm in most systems), but is typically set to achieve a low, time-averaged load reflection coefficient magnitude as measured by a wideband measurement system. As a consequence, in many implementations, the wideband measurement component 116 or 120 is utilized to capture at least the first order mixing products. The wideband measurement component 116 or 120 may be implemented as an integral component of the matching network 106, the high frequency generator 102, or may be implemented as a separate component. Thus, the step of adjusting the matching network at Block 740 is different from what is normally required of a matching network 106.

In many implementations, the impedance presented to the filter 104 by the plasma chamber 100 is adjusted to optimize efficiency of power transfer from the high-frequency generator 102 to the plasma chamber 100. For example, the time-average of an absolute value of the load reflection coefficient presented to the filter may be minimized, and the load reflection coefficient may be measured (e.g., by the wideband measurement component 116 or 120) using a bandwidth at least equal to the frequency of the low-frequency generator 108. It is also contemplated that a time-average of a load reflection coefficient is optimized away from 0+j0.

Referring again to FIG. 7, a length of cables between the matching network 106 and the filter 104 may be adjusted (e.g., optimized) to control the impedance with which the mixing products are terminated (Block 750). Although cable lengths (between a match network and a plasma processing chamber) are adjusted in other plasma processing systems (e.g., for stability), when the filter 104 is used, there are additional considerations when choosing this cable length, namely: the termination impedance provided to the plasma system at the frequencies of the mixing products by the filter 104; cables connecting the filter 104 to the matching network 106; and the matching network 106. Changing the cable length changes the nature of the modulation on the load side of the filter 104. This cable length also affects frequency tuning in multi-state applications; thus, the choice of this cable length may be more complicated than in prior plasma processing systems.

Figure 8A:
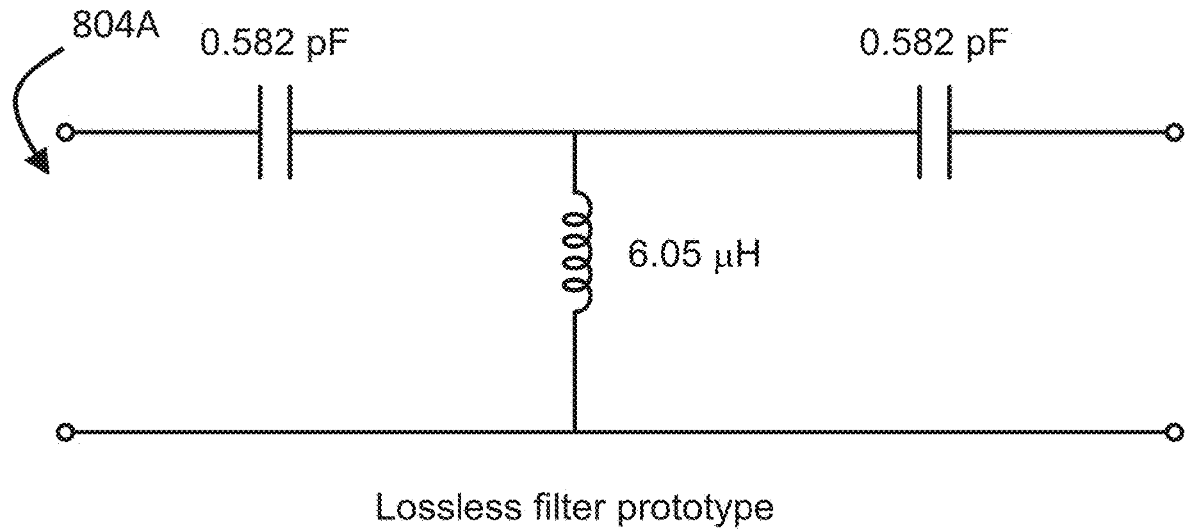
FIGS. 8A and 8B are diagrams depicting equivalent circuits of embodiments of the filter described with reference to FIG. 1.
Figure 8B:
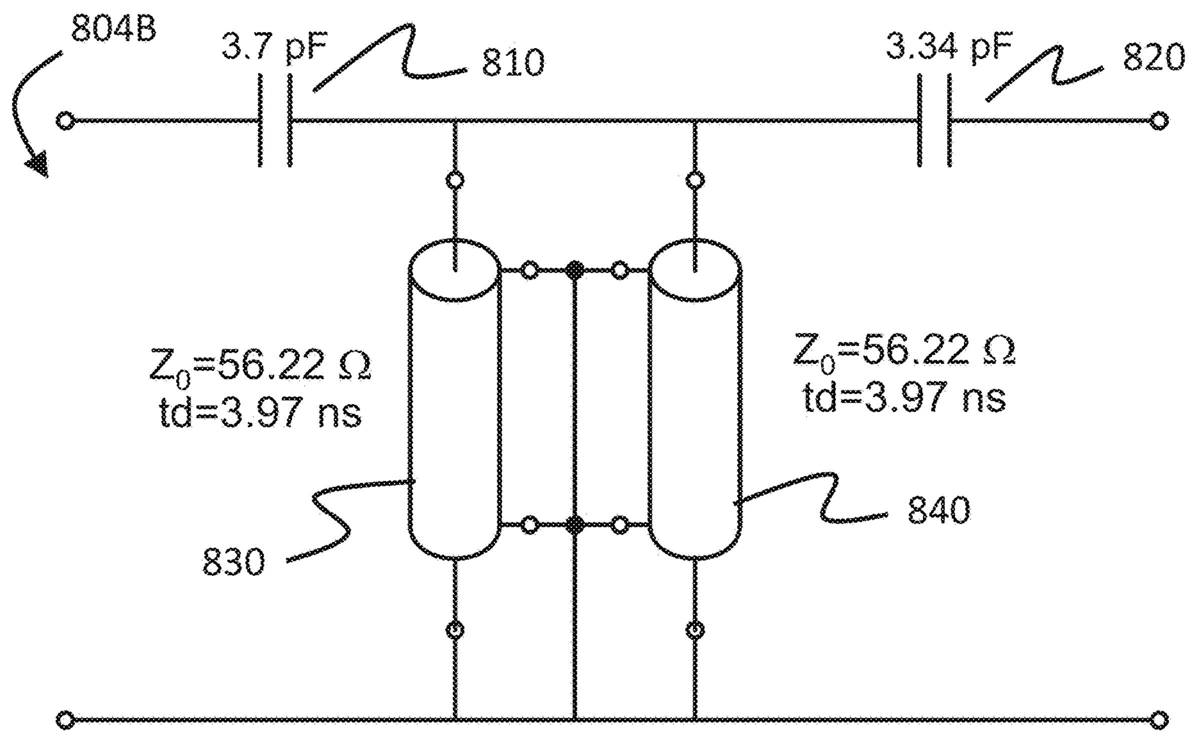

FIGS. 8A and 8B are equivalent circuits of embodiments of the filter 104 described with reference to FIG. 1. FIG. 8A shows the equivalent circuit of a lossless prototype, and FIG. 8B shows the equivalent circuit of the filter 104 when reduced to practice using realizable lossy components. There are other ways of realizing such a narrowband, high power filter (for example using a large ring resonator or cavity), but in all cases careful attention must be paid to high voltages, high currents, and high-power dissipation present in such filters.

Figure 9:
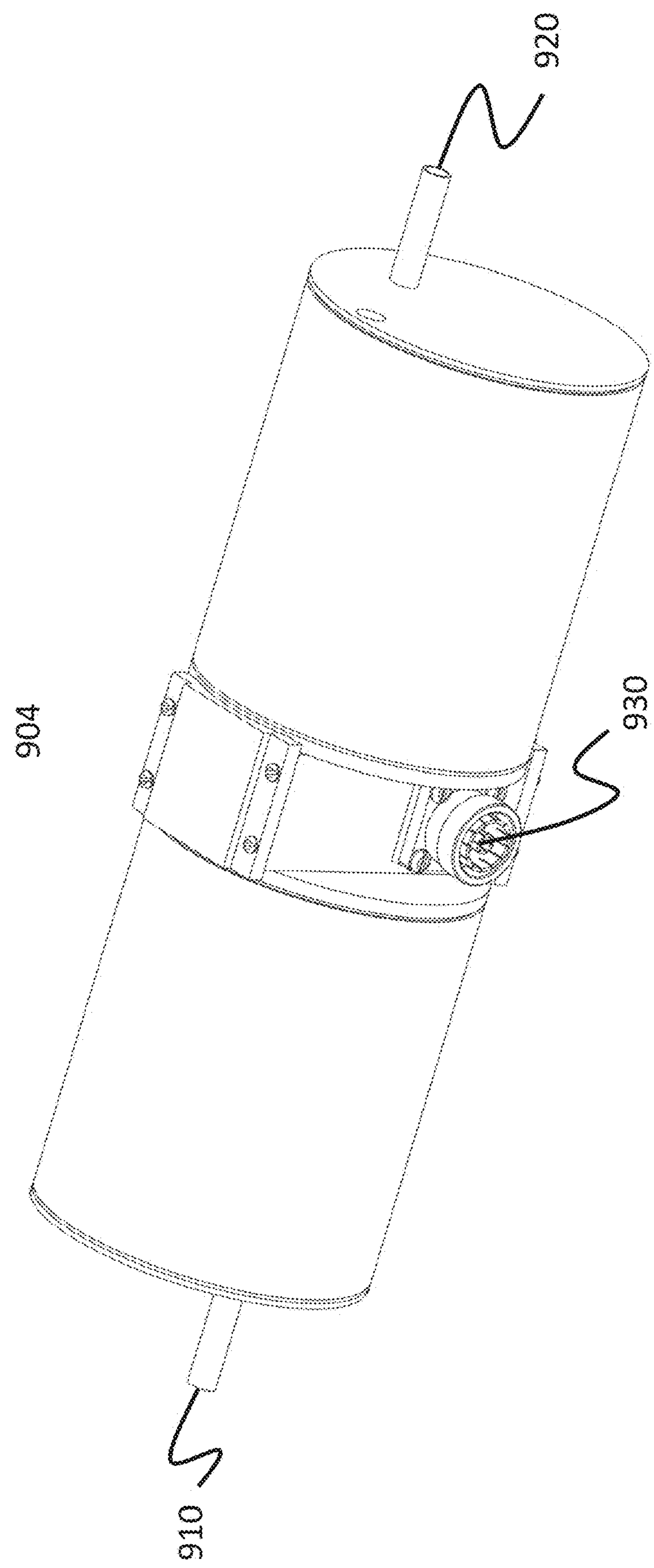
FIG. 9 is a perspective view of an exemplary water-cooled filter design with two parallel helical resonators.

Referring next to FIG. 9, shown is a perspective view of the exterior of a water-cooled filter 904 designed with two parallel helical resonators. The filter contains two water connections 910 and 920 for passing water through the filter for cooling, an input connector 930, and an output connector (not visible in this view).

Figure 10:
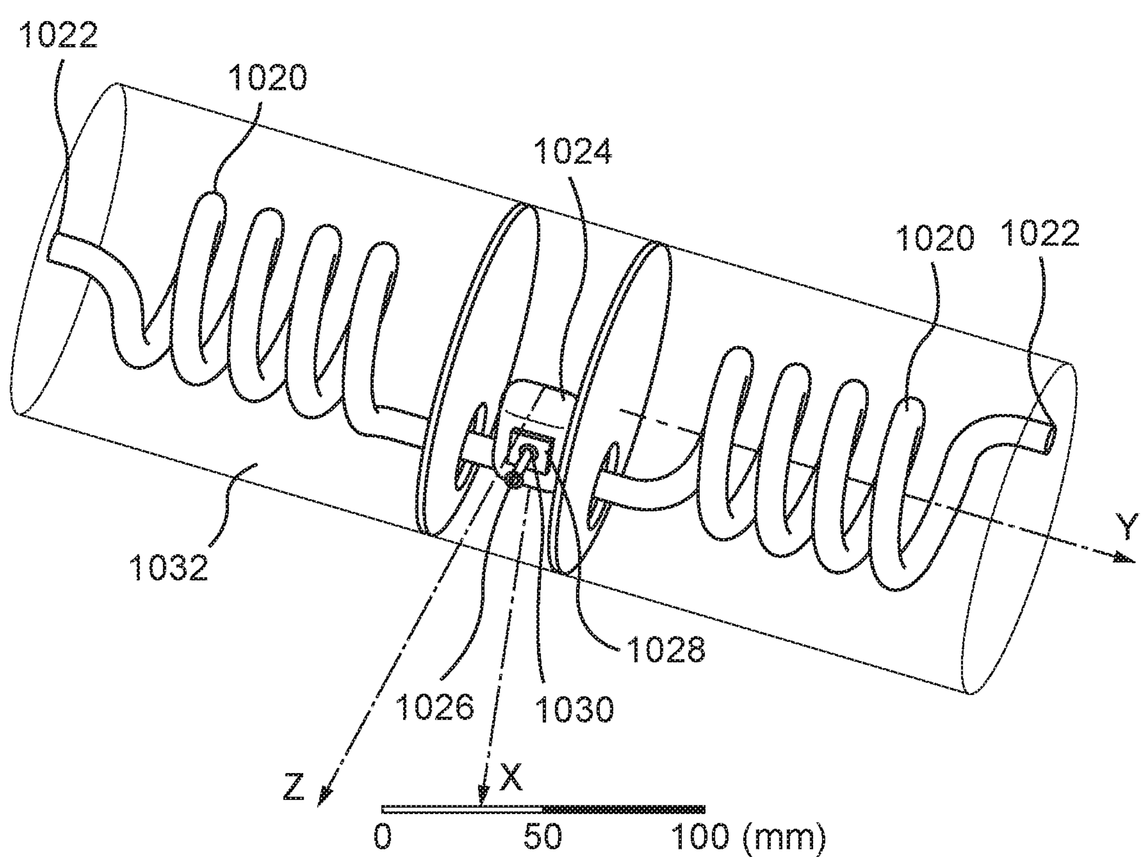
FIG. 10 is a view of the interior of a water-cooled filter design with two parallel helical resonators.

FIG. 10 is a view of the interior of the filter 904 design with two parallel helical resonators. As shown, each of the helical resonators includes a hollow helical coil 1020, and each hollow helical coil 1020 is coupled to a copper block 1024. Extending from the copper block 1024 are copper straps 1026, and insulating the copper straps 1026 from the copper block 1024 are ceramic insulators 1028. In this implementation, metallization 1030 is disposed on the ceramic 1028 to form input and output capacitors 810 and 820. In addition, each hollow helical coil 1020 includes a grounded end 1022. The filter 904 also includes a potted cylindrical enclosure 1032 (represented transparently for purposes of viewing internal components of the filter 104) that surrounds the hollow helical coils 1020 and the copper block 1024.

Figure 11:
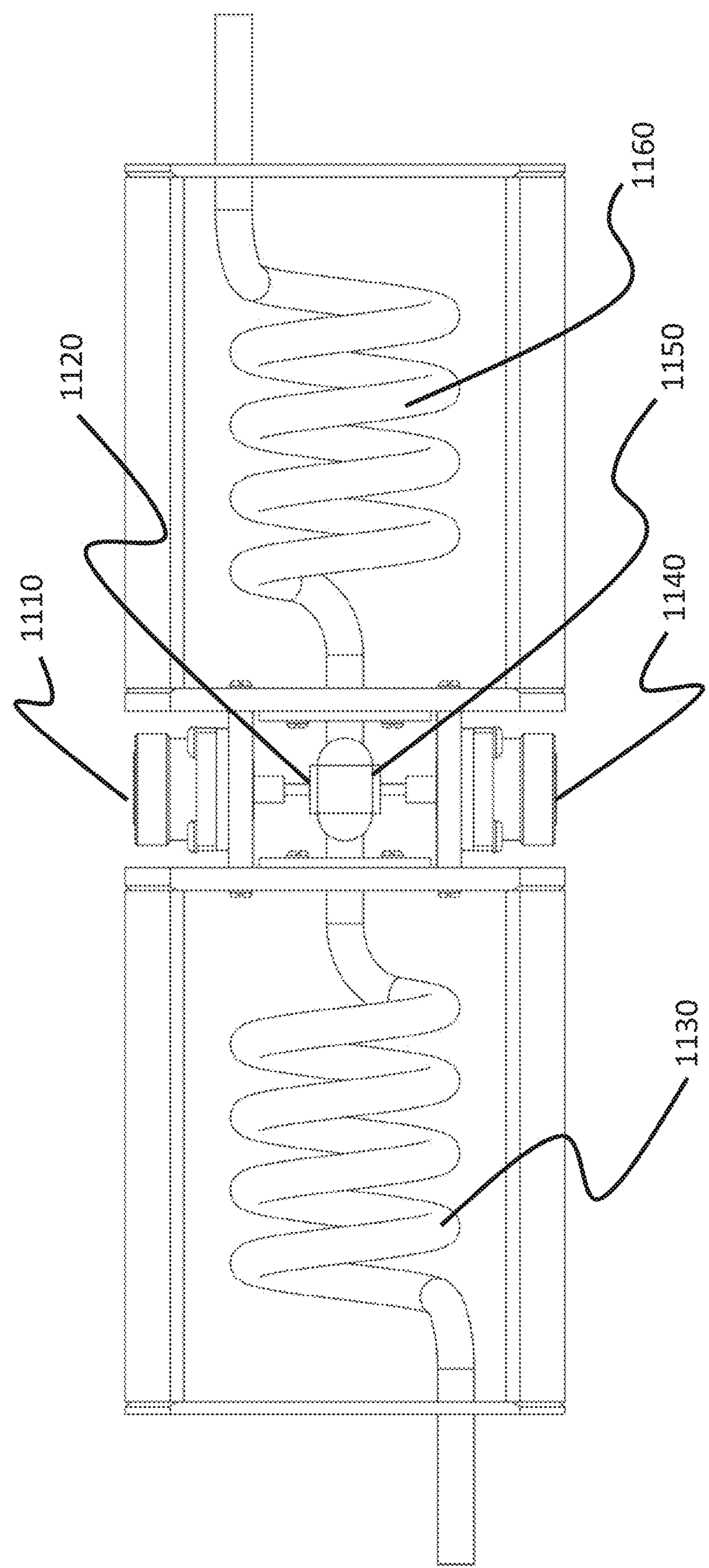
FIG. 11 is a cutaway view of a water-cooled filter design with two parallel helical resonators.

FIG. 11 shows a cutaway view of the filter 904. This view shows how the copper straps 1026 connect to the input and output connectors, 1110 and 1140, to the capacitors formed on the ceramic insulators 1120 and 1150. This view also shows how the hollow helical coils 1130 and 1160 connect to the copper block 1024.

Figure 12:
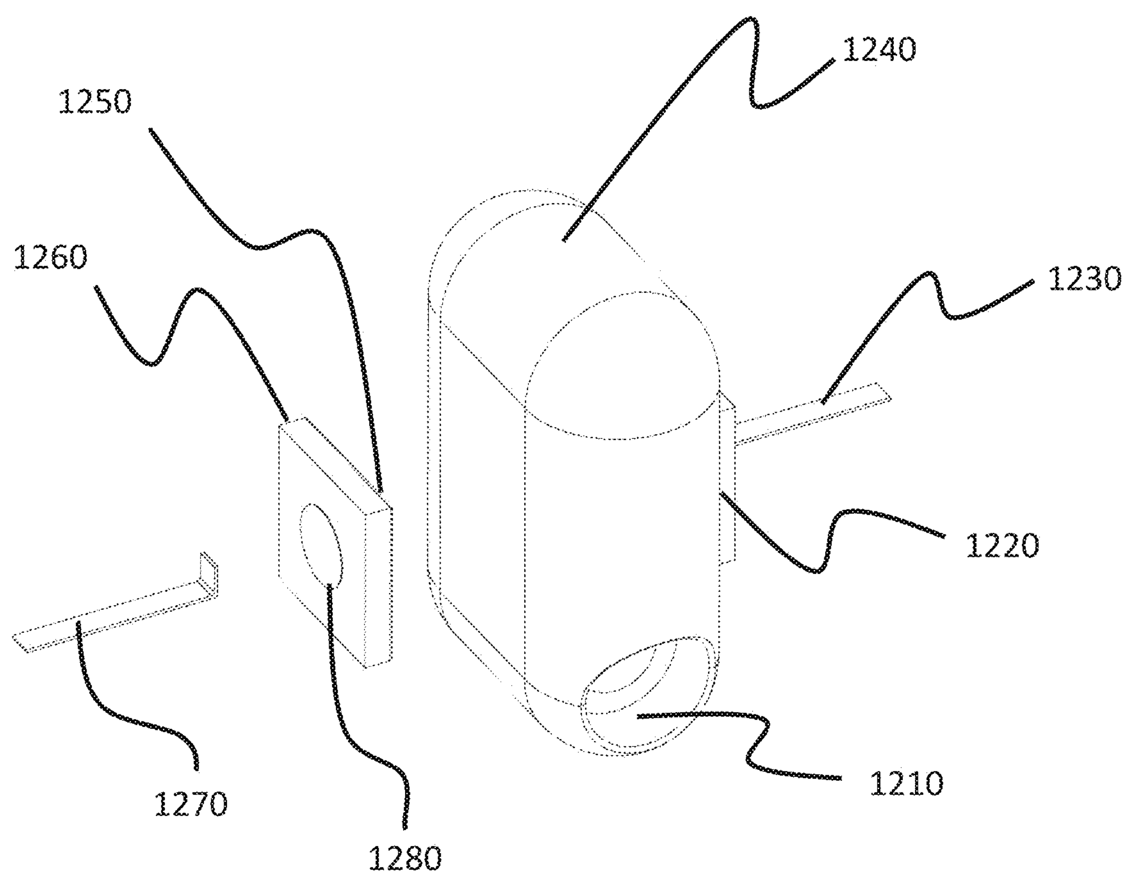
FIG. 12 is a detail view of the capacitor block of a water-cooled filter design with two parallel helical resonators.

FIG. 12 shows more detail of the copper block 1240 (1024 in FIG. 10). This assembly provides the required capacitive coupling from the input and output to the helical resonators. Due to the small value of the capacitors required, the high voltage the capacitors must withstand, and the power the capacitors must dissipate, implementing the capacitors on a ceramic substrate is used in the design of the filter. The copper block contains a water channel 1210 into which the hollow helical coils are attached (by e.g. soldering). The capacitors formed on the ceramic insulators 1220 and 1260 are thus water cooled. The ceramic insulators have front and back metallization 1280 and 1250, respectively. The size of the front metallization 1280 controls the capacitance realized by the assembly. The ceramic insulators can be attached to the copper block 1240 using electrically conductive epoxy. The straps 1270 and 1230 can be soldered to the front metallization and to the connectors 1110 and 1140.

Figure 13:
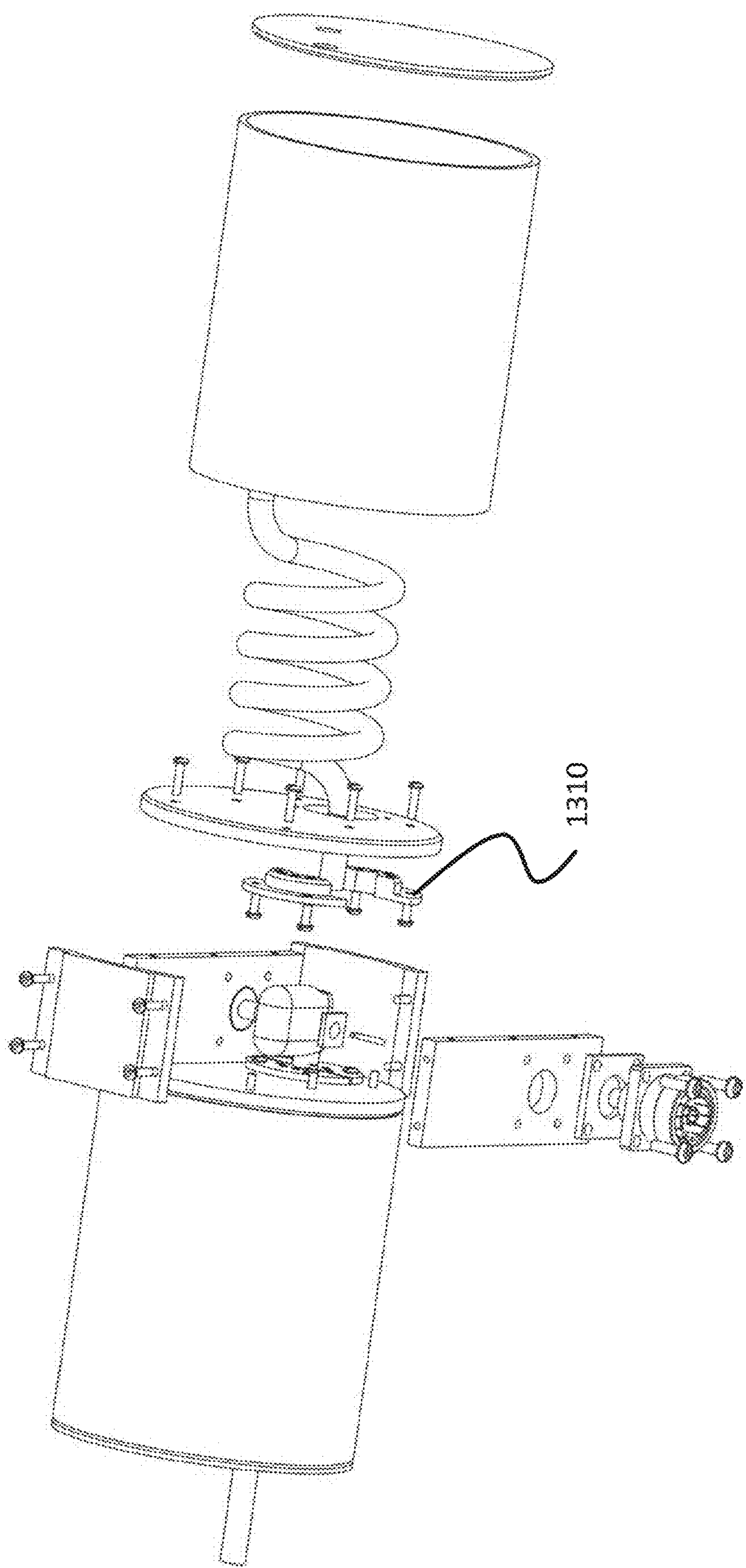
FIG. 13 is an exploded view of a water-cooled filter design with two parallel helical resonators.

FIG. 13 shows an exploded view of the filter 904. An insulating bracket 1310 holds the hollow helical coils in place and provides mechanical stability to the assembly. The bracket is made from a suitable low loss dielectric material, e.g. PTFE plastic or ceramic and contains holes to allow the potting material to flow through. Due to the high voltages that may be encountered in this design, the high voltage area of the filter is potted (e.g. using silicone dielectric gels) to reduce the risk of failure due to the breakdown of air. Alternatively, the entire assembly can be evacuated to a high vacuum or filled with a high-quality dielectric liquid.

It should be recognized that those of ordinary skill in the art, in view of the present disclosure, are able to design aspects of the helical coils 1020 (e.g., a number of turns, radius, length, pitch, inner and outer coil diameter, and outside diameter of coil) to achieve the desired bandwidth and heat dissipation. It should also be recognized that variations of the design of the filter 904 depicted in FIGS. 9-13 are certainly contemplated.

Using helical resonators close to resonance on the low frequency or inductive side of resonance rather than an inductor achieves a similar bandwidth as compared to a design using an inductor, but in contrast to a design with an inductor, the helical resonators provide a smaller effective inductance. In addition, using two resonators in parallel allows ground-connected water cooling of the entire assembly where the water system can remain grounded. More specifically, water provided from the ground-connected water system is fed through the hollow helical coils 1020 enabling a large amount of heat to be dissipated. For example, the filter 904 (and variations of the filter 904) may operate at relatively high-power levels (e.g., in the 1 kW to 30 kW power range). By virtue of its design, the filter 904 (and its variations) may operate at relatively high-power levels while operating at efficiencies of at least 75%.

Figure 14:
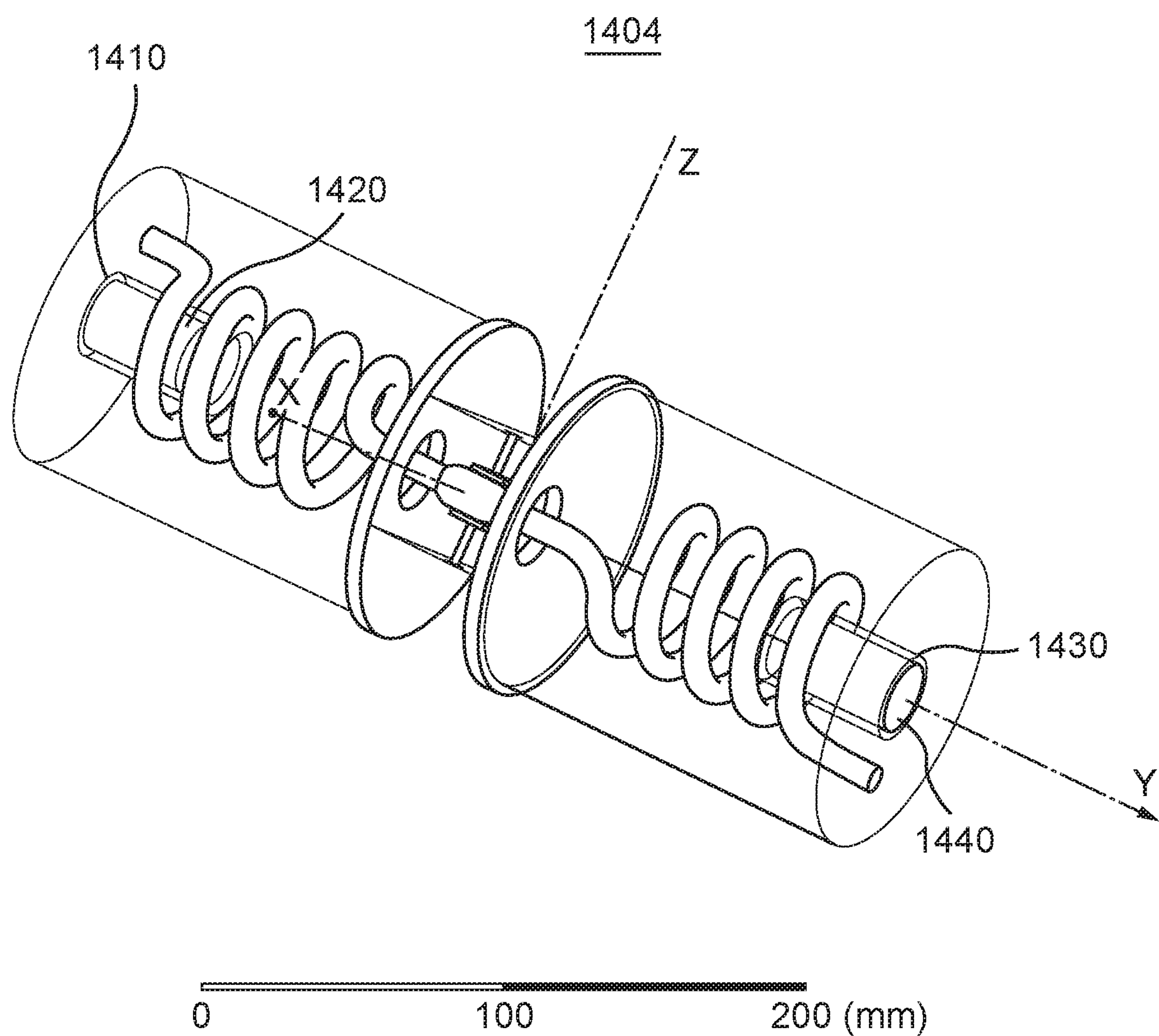
FIG. 14 is a view of a filter including provision to tune the filter.

FIG. 14 shows a filter 1404 with tuning slugs. Tuning may be required for setting the passband frequency of the filter due to component manufacturing tolerance, but may also be actively adjusted to compensate for changes in component values due to, for example, self-heating of the filter 1404. The tuning slugs 1420 and 1440 may be, for example, ferrite rods that may be moved along the depicted Y axis within the hollow helical coils 1020, but more typically, the tuning slugs may be made of copper. Cups 1420 and 1430 made of suitable insulators (e.g. PTFE plastic) provide an area free of potting compound in which the tuning slugs can be moved.

The use of the filter 104, 804B, 904, 1404 compresses the frequency range over which frequency tuning (for impedance matching) can be done to a very small frequency range. This requires a different approach to deal with multi-state operation of the generator. An example of multi-state operation may be switching between multiple power levels in which each power level represents a state and in which the high-frequency generator 102 sees a different load impedance in each state due to the nonlinear nature of the plasma load and where the high-frequency generator 102 may operate at a different frequency in each state in order to improve impedance matching or stability for that state. To facilitate multi-state operation in a system using the filter 104, one may need to ensure that the impedances presented to the load side of the filter 104 for the different states lie along or close to the line of impedances that can be matched by frequency tuning the high-frequency generator 102 frequency. This can be done by adding a fixed or variable time-delay, such as delay 112, on the load side of the filter.

Figure 15:
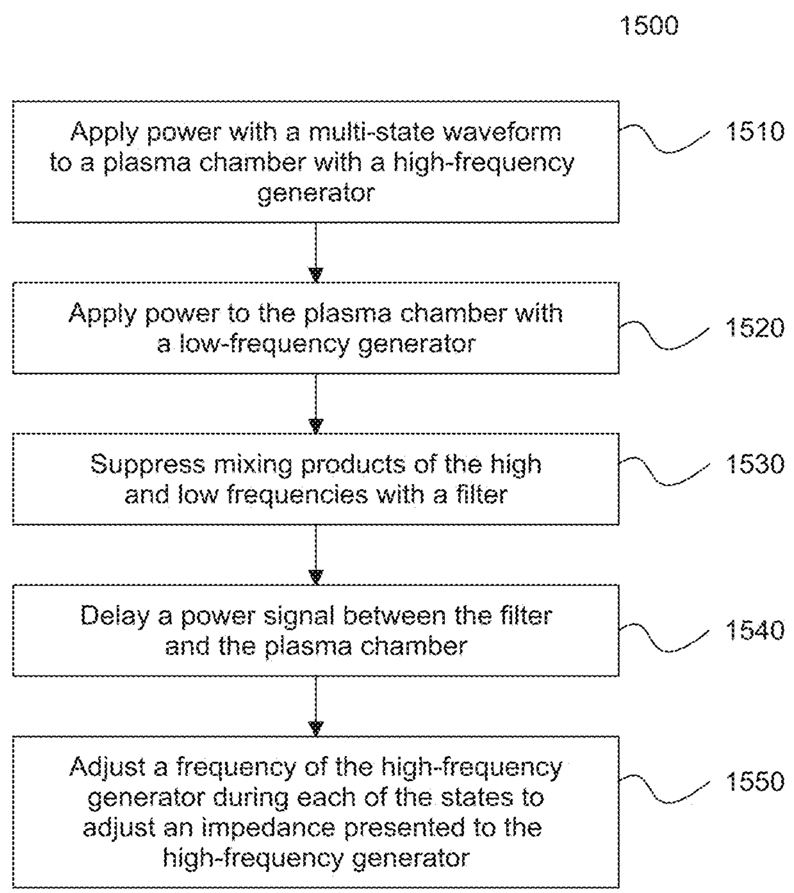
FIG. 15 is a flowchart depicting a method that may be traversed in connection with embodiments disclosed herein.

Referring next to FIG. 15, shown is a flowchart 1500 depicting a method that may be carried out in connection with embodiments disclosed herein. As shown, power with a multi-state waveform is applied to the plasma chamber 100 with the high-frequency generator 102 (Block 1510), and power is also applied to the plasma chamber 100 with a low frequency generator 108 (Block 1520). Mixing products of the high and low frequencies are suppressed with the filter 104 (Block 1530). And as shown, a power signal between the filter 104 and the plasma chamber 100 is delayed (Block 1540), and a frequency of the high-frequency generator 102 is adjusted during each of the states to adjust an impedance presented to the high-frequency generator (Block 1550).

Accurate power measurement may require measuring power on the load side of the filter with a bandwidth sufficient to capture a sufficient number of mixing products. This is so because the efficiency of the filter 104 is dependent on the trajectory of the load impedance presented to the filter 104. Measuring on the high-frequency generator 102 side of the filter 104 may not provide an accurate measure of power delivered to the plasma load because it is difficult if not impossible to take into account the efficiency of the filter 104.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 16:
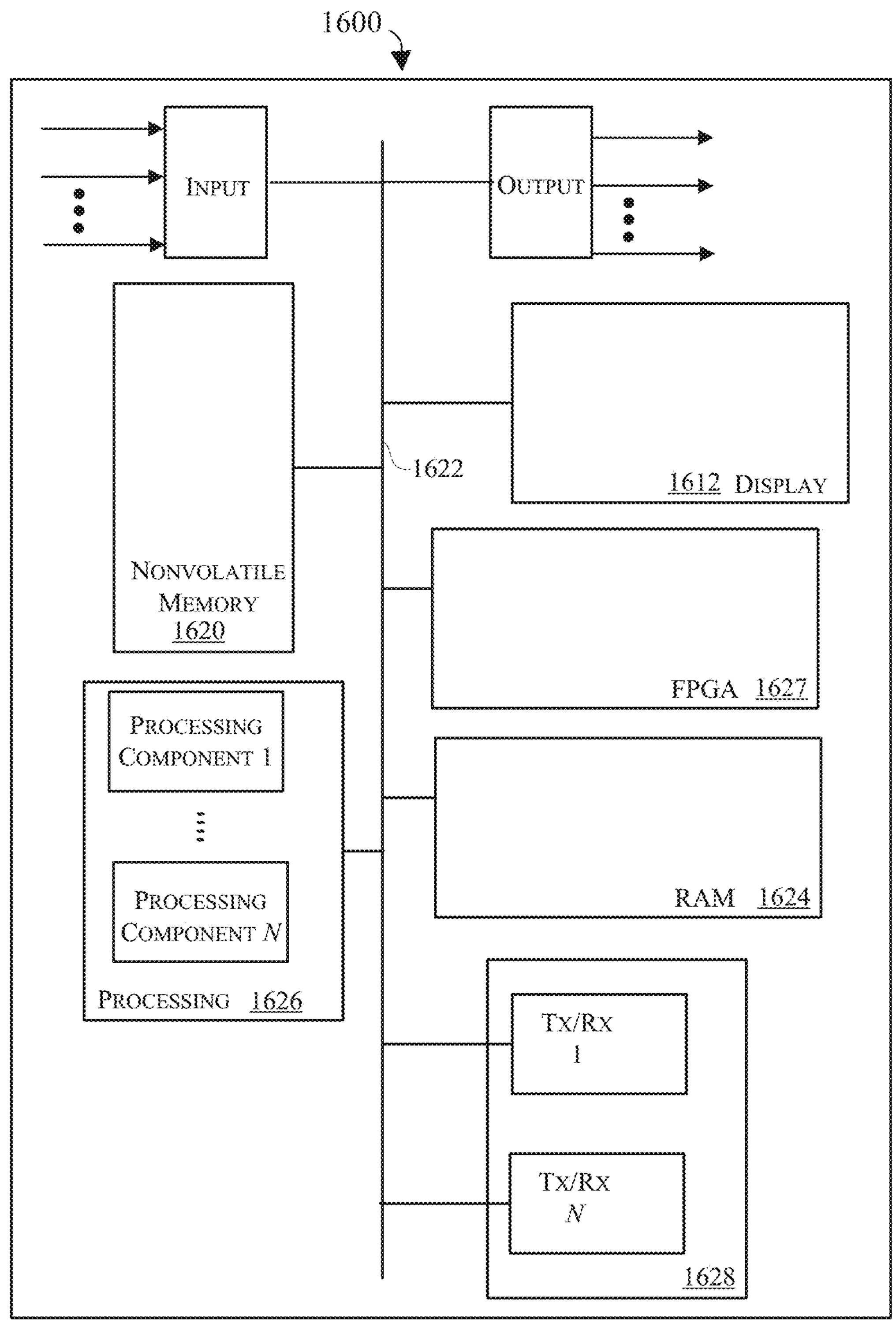
FIG. 16 is a block diagram depicting a computing device that may be utilized in connection with embodiments disclosed herein.

Referring to FIG. 16, shown is an an example of a computing system 1600 that may be utilized in connection with the embodiments disclosed herein. As shown, a display portion 1612 and nonvolatile memory 1620 are coupled to a bus 1622 that is also coupled to random access memory ("RAM") 1624, a processing portion (which includes N processing components) 1626, a field programmable gate array (FPGA) 1627, and a transceiver component 628 that includes N transceivers. Although the components depicted in FIG. 16 represent physical components, FIG. 16 is not intended to be a detailed hardware diagram; thus, many of the components depicted in FIG. 16 may be realized by common constructs or distributed among additional physical components. Moreover, it is contemplated that other existing and yet-to-be developed physical components and architectures may be utilized to implement the functional components described with reference to FIG. 16.

This display portion 1612 generally operates to provide a user interface for a user, and in several implementations, the display is realized by a touchscreen display. In general, the nonvolatile memory 1620 is non-transitory memory that functions to store (e.g., persistently store) data and machine readable (e.g., processor executable) code (including executable code that is associated with effectuating the methods described herein). In some embodiments for example, the nonvolatile memory 1620 includes bootloader code, operating system code, file system code, and non-transitory processor-executable code to facilitate the execution of the methods described with reference to FIGS. 4 and 5 described further herein.

In many implementations, the nonvolatile memory 1620 is realized by flash memory (e.g., NAND or ONENAND memory), but it is contemplated that other memory types may be utilized as well. Although it may be possible to execute the code from the nonvolatile memory 1620, the executable code in the nonvolatile memory is typically loaded into RAM 1624 and executed by one or more of the N processing components in the processing portion 1626.

In operation, the N processing components in connection with RAM 1624 may generally operate to execute the instructions stored in nonvolatile memory 1620 to realize aspects of the wideband measurement system 116, 120 and control aspects of the high-frequency generator 102 (e.g., frequency tuning aspects) and match 106. For example, non-transitory processor-executable instructions to effectuate aspects of the methods described with reference to FIGS. 7 and 15 may be persistently stored in nonvolatile memory 1620 and executed by the N processing components in connection with RAM 1624. As one of ordinarily skill in the art will appreciate, the processing portion 1626 may include a video processor, digital signal processor (DSP), graphics processing unit (GPU), and other processing components.

In addition, or in the alternative, the field programmable gate array (FPGA) 1627 may be configured to effectuate one or more aspects of the methodologies described herein (e.g., the methods described with reference to FIGS. 7 and 15). For example, non-transitory FPGA-configuration-instructions may be persistently stored in nonvolatile memory 1620 and accessed by the FPGA 1627 (e.g., during boot up) to configure the FPGA 627 to realize aspects of the wideband measurement system 116, 120 and control aspects of the high-frequency generator 102 (e.g., frequency tuning aspects) and match 106.

The input component may operate to receive signals (e.g., from sensors 114, 118) that are indicative of one or more aspects of power. The signals received at the input component may include, for example, voltage, current, forward power, reflected power and plasma load impedance. The output component generally operates to provide one or more analog or digital signals to effectuate an operational aspects of the generators 102, 108, match 106, and/or wideband measurements systems 116, 120. For example, the output portion may provide control signals utilized by the generators 102, 108, match 106, and/or wideband measurements systems 116, 120.

The depicted transceiver component 628 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A plasma processing system comprising:
a high-frequency generator configured to deliver power to a plasma chamber;
a low-frequency generator configured to deliver power to the plasma chamber; and
a filter coupled between the plasma chamber and the high-frequency generator, the filter configured to suppress power outside of a bandwidth around a frequency of the high-frequency generator,
wherein the suppression of power at the frequency of the high-frequency generator is at most 2 dB,
and wherein the suppression of power at frequencies more than the frequency of the low-frequency generator from the frequency of the high-frequency generator is at least 2 dB higher than the suppression of power at the frequency of the high-frequency generator.

2. The system of claim 1, wherein the filter is configured for ground-connected water cooling.

3. The system of claim 1, wherein the bandwidth of the filter is 2% or less of the frequency of the high-frequency generator.

4. The system of claim 1, wherein the bandwidth of the filter is 1.2 MHz or less.

5. The system of claim 1, wherein the filter is configured to operate in the 1 kW to 30 kW power range.

6. The system of claim 1, wherein the filter is configured to be at least 75% efficient.

7. The system of claim 1, wherein a fixed or variable time delay is inserted between the filter and the plasma chamber.

8. The system of claim 1, wherein the high frequency generator is configured to supply power at 60 MHz.

9. The system of claim 1, wherein the low frequency generator is configured to supply power at 400 kHz.

10. The system of claim 1, wherein the filter is tunable to compensate for manufacturing tolerances.

11. The system of claim 1, wherein the filter is tunable to compensate for drift due to self-heating of the filter.

12. The system of claim 1, further comprising a wideband power measurement system on the plasma chamber side of the filter.

13. A plasma processing system comprising:
a high-frequency generator configured to deliver power to a plasma chamber;
a low-frequency generator configured to deliver power to the plasma chamber;
a filter coupled between the plasma chamber and the high frequency generator, the filter including two or more helical resonators connected in parallel; and
a fixed or variable time delay coupled between the filter and the plasma chamber.

14. The system of claim 13, wherein the filter is configured for ground-connected water cooling.

15. The system of claim 13, wherein the helical resonators are potted.

16. The system of claim 13, wherein the helical resonators are configured to capacitively couple to the rest of the filter.

17. A method for filtering power in a plasma processing system comprising:
supplying power to a plasma chamber with a high-frequency generator to ignite and sustain a plasma;
supplying power to a plasma chamber with a low-frequency generator that is connected to the plasma; and
suppressing power mixing products with a filter to limit variation of a time-varying load reflection coefficient presented to the high frequency generator.

18. The method of 17, including:
cooling the filter using ground-connected water cooling.

19. The method of 17, including:
delaying a power signal between the filter and the plasma chamber to enable impedances presented to the filter to be matched by frequency tuning the high-frequency generator.

20. The method of claim 17, including:
tuning the frequency of the high-frequency generator for impedance matching.

21. The method of claim 17, including:
adjusting the impedance presented to the filter by the plasma chamber to optimize efficiency of power transfer from the high frequency generator to the plasma chamber.

22. The method of claim 21, including:
minimizing the time-average of the absolute value of load reflection coefficient presented to the filter measured with a measurement system with a bandwidth at least equal to the frequency of the low-frequency generator.

23. The method of claim 21,
wherein a time-average of a load reflection coefficient is optimized away from 0+j0.

* * * * *